(12) United States Patent
Defrance et al.

(10) Patent No.: US 8,170,012 B2
(45) Date of Patent: *May 1, 2012

(54) PHASE CONTROL OF A SYNCHRONIZATION SIGNAL IN A PACKET SWITCHING NETWORK

(75) Inventors: Serge Defrance, Rennes (FR); Thierry Tapie, Rennes (FR); Philippe Rio, Rennes (FR)

(73) Assignee: Thomson Licensing, Boulogne, Billancourt (FR)

( * ) Notice: Subject to any disclaimer, the term of this patent is extended or adjusted under 35 U.S.C. 154(b) by 80 days.

This patent is subject to a terminal disclaimer.

(21) Appl. No.: 12/451,995

(22) PCT Filed: Jun. 6, 2008

(86) PCT No.: PCT/EP2008/057092
§ 371 (c)(1),
(2), (4) Date: Dec. 11, 2009

(87) PCT Pub. No.: WO2008/151995
PCT Pub. Date: Dec. 18, 2008

(65) Prior Publication Data
US 2010/0118870 A1 May 13, 2010

(30) Foreign Application Priority Data
Jun. 12, 2007 (FR) ...................... 07 55691

(51) Int. Cl.
*H04L 12/28* (2006.01)
*H04J 3/00* (2006.01)
*H04N 9/475* (2006.01)
(52) U.S. Cl. ........ 370/389; 370/356; 370/392; 370/464; 370/498; 370/503; 348/512; 348/513
(58) Field of Classification Search .......... 370/224–503; 348/497–544
See application file for complete search history.

(56) References Cited

U.S. PATENT DOCUMENTS
3,926,511 A * 12/1975 Gendrot et al. ................... 352/5
(Continued)

FOREIGN PATENT DOCUMENTS
EP 1471745 10/2004
(Continued)

OTHER PUBLICATIONS

IEEE Instrumentation and Measurement Society: "IEEE std 1588-2002 IEEE Standard for a Precision Clock Synchronization Protocol for Networked Measurement and Control Systems (Part)" IEEE Standards, Nov. 8, 2002, pp. 10-25, 79-82 XP002467037.

(Continued)

*Primary Examiner* — Ayaz Sheikh
*Assistant Examiner* — Venkatesh Haliyur
(74) *Attorney, Agent, or Firm* — Jeffrey D. Carter

(57) ABSTRACT

A device is operative to send packets in a packet communication network having at least two stations. According to an exemplary embodiment, the device operates by: extracting image pips on the basis of a synchronization signal; initializing a first counter on the basis of the the image pips; initializing a second counter according to zero-crossings of the first counter; sampling the second counter every period $T_{smp}$, where $T_{smp}$ emanates from a time base synchronized on all the stations of the network; sending packets containing the samples of the second counter in the network; receiving at least one phase deviation value $\Delta\phi$ to be applied; and sending the at least one phase deviation value $\Delta\phi$ in the network. The present invention also pertains to a device operative to receive packets in a packet communication network having at least two stations.

11 Claims, 8 Drawing Sheets

U.S. PATENT DOCUMENTS

| | | | |
|---|---|---|---|
| 5,303,050 A * | 4/1994 | Nishimura et al. | 348/211.2 |
| 5,745,185 A * | 4/1998 | Portron et al. | 348/513 |
| 7,835,402 B2 * | 11/2010 | Erich et al. | 370/503 |
| 7,903,694 B2 * | 3/2011 | Defrance et al. | 370/503 |
| 8,054,859 B2 * | 11/2011 | Defrance et al. | 370/503 |
| 2004/0017486 A1 | 1/2004 | Cooper et al. | |
| 2004/0264478 A1 | 12/2004 | Van Der Valk et al. | |
| 2006/0224336 A1 * | 10/2006 | Petras et al. | 702/62 |
| 2007/0153132 A1 * | 7/2007 | Jong | 348/705 |
| 2008/0019398 A1 * | 1/2008 | Genossar et al. | 370/498 |
| 2008/0170588 A1 * | 7/2008 | Tapie et al. | 370/464 |
| 2009/0022247 A1 * | 1/2009 | Kim et al. | 375/321 |
| 2009/0073976 A1 * | 3/2009 | Defrance et al. | 370/389 |
| 2010/0042748 A1 * | 2/2010 | Tapie et al. | 709/248 |
| 2010/0115047 A1 * | 5/2010 | Briscoe et al. | 709/208 |
| 2010/0118870 A1 * | 5/2010 | Defrance et al. | 370/389 |
| 2010/0135288 A1 * | 6/2010 | Tapie et al. | 370/389 |
| 2010/0135333 A1 * | 6/2010 | Defrance et al. | 370/503 |

FOREIGN PATENT DOCUMENTS

| | | | |
|---|---|---|---|
| EP | 1628469 | | 2/2006 |
| EP | 1768383 | | 3/2007 |
| EP | 2150063 A1 | * | 2/2010 |
| FR | 2898452 A1 | * | 9/2007 |
| FR | 2898453 | | 9/2007 |
| JP | 2010035164 A | * | 2/2010 |
| WO | WO 2006/063925 | | 6/2006 |
| WO | WO 2008151995 A1 | * | 12/2008 |
| WO | WO 2008151996 A1 | * | 12/2008 |
| WO | WO 2010037916 A1 | * | 4/2010 |

OTHER PUBLICATIONS

Search Report Dated Sep. 8, 2008.
MPEG-2, Part 1 : System (extract) ISO/IEC, No. DIS13818-1, 1995, pp. 98-100.

* cited by examiner

PHASE CONTROL OF A SYNCHRONIZATION SIGNAL IN A PACKET SWITCHING NETWORK

This application claims the benefit, under 35 U.S.C. §365 of International Application PCT/EP2008/057092, filed Jun. 6, 2008, which was published in accordance with PCT Article 21(2) on Dec. 18, 2008 in English and which claims the benefit of French patent application No. 0755691, filed Jun. 12, 2007.

FIELD OF THE INVENTION

The present invention pertains to the field of video equipment.

The present invention pertains more particularly to a sender device and to a receiver device for the transmission of a synchronization signal, for example of "Genlock" type (synchronization locking) controlled in phase, on a packet switching communication network, for example of IP type (the acronym standing for the expression "Internet Protocol"), whether the network is wired (for example Ethernet (IEEE802.3)) or non-wired (for example IEEE 802.16 D-2004).

PRIOR ART

Progress in the capacity of IP networks to transport signals of any type (data or video) implies that it is possible to use such networks as a "backbone" architecture for video studios. A major benefit of this advance is that there is then a unique infrastructure for data transport. Whereas in the past, several media were required in order to transport various types of signals between equipment, the multiplexing properties offered by the IP layer make it possible to reduce the number of media required to one: an IP network which links the various items of equipment.

In the prior art, the synchronization of video equipment (cameras, etc.) in a studio is done by transmitting a synchronization signal commonly called "Genlock" or else "black burst". For example, the Genlock signal is composed of two synchronization signals, one is repeated every 40 ms and indicates the start of the video frame, the other is repeated every 64 µs (for a standard format and less for an HD format) and indicates the start of the lines in the video frame. The waveforms of the synchronization signals are dependent on the format of the image transmitted on the network. For example for a high-definition image, the synchronization signal has a form that is termed tri-level (−300 mV, 0 V, +300 mV).

A known drawback exhibited by an IP/Ethernet network stems from the fact that it introduces strong jitter into a signals transmission and in particular for the transmission of a synchronization signal. When such a signal is trunked by an IP/Ethernet link to various items of equipment to be synchronized, this jitter results in temporal fluctuations in the duration with which the information carried by the synchronization signal reaches the equipment.

In the prior art, devices are known for reconstructing, at the level of each camera, a timing clock specific to this camera and making it possible to circumvent jitter induced by transmission on the network. The principle of these devices relies on strong attenuation of the amplitude of the jitter of the synchronization signal at the reception level. It is thus possible to guarantee that an image generated by a camera is rigorously in phase with all the images generated by the neighbouring cameras linked to the same network.

Examples of such devices for attenuating jitter are described in international application PCT FR2007/050918; they act on so-called digital counting signals (or PCR, which is the acronym standing for the expression "Program Clock Reference"), which are representative of very precise reference clock signals. These digital signals are provided to cameras through a network so that they can locally reconstruct clock signals in phase with the reference clock. International patent application PCT FR2007/050918 proposes thus a sending device and a reception device making it possible to alleviate the effects of the jitter. In this international patent application, a sending device able to send packets in a communication network is described by packets comprising at least two stations and a reception device able to receive packets of a similar network.

However, a set of cameras linked together by an IP/Ethernet network and synchronized by means of a jitter attenuation device of the prior art presents a drawback. Specifically, when a mixer is connected to this same network, the images produced by the various cameras are not all presented to it in a synchronous manner, because for example of a difference in the duration of transmission of the video signal existing between the various cameras and the mixer.

This drawback is alleviated by tailoring the synchronization signals for each of the cameras in such a way, for example, that the video signals produced by the cameras are presented simultaneously on the mixer. In this case, they no longer exactly correspond to the same instant.

The problem to be solved then consists of the transmission of an image pip up to a remote item of equipment through an IP/Ethernet network, the image pip received by the remote item of equipment having a delay of value that is controlled with the image pip sent. This amounts to finding a means making it possible to generate on remote items of equipment connected to a network, video clocks and image synchronization pips suited to each item of equipment. These two signals make it possible to regenerate a Genlock signal phase-shifted by a value that is controlled with a reference Genlock signal.

OVERVIEW OF THE INVENTION

The technical problem that the present invention proposes to solve is the transmission of a synchronization signal through a packet switched network with non-constant transmission time with a phase shift of value that is controlled, with respect to a reference synchronization signal.

For this purpose, the present invention relates, according to a first aspect, to a sending device able to send packets in a packet communication network comprising at least two stations, the said device comprising means for:
  extracting image pips on the basis of a synchronization signal;
  initializing an image counter on the basis of the said image pips;
  initializing a counter CPT_PCR every "m" zero-crossings of the image counter, the counter CPT_PCR being regulated by a clock produced by the image counter;
  sampling the counter CPT_PCR every period $T_{smp}$, where $T_{smp}$ emanates from a time base synchronized on all the stations of the said network; and
  sending packets containing the samples PCR, of the counter CPT_PCR in the network,
characterized in that it comprises, furthermore, means for:
  receiving at least one phase deviation value $\Delta\phi$ to be applied;

when the phase deviation value Δφ is received, sending the value Δφ in the network.

Preferably, the synchronization signal is of Genlock type.

According to an embodiment, the first send side counter can be a 40-ms counter and the second counter is a PCR counter.

According to a particular mode of implementation, the time base synchronized on all the stations of the network is of IEC61588 type.

The present invention relates, according to a second aspect, to a reception device able to receive packets in a packet communication network comprising at least two stations, the said device comprising means for:

receiving packets containing samples $PCR_r$ of the said network, the said samples $PCR_r$ originating from data sampled every period $T_{smp}$, where $T_{smp}$ emanates from a time base synchronized on all the stations of the said network;

regenerating a counting ramp $CSR\_PCR_1$ with the aid of a phase-locked loop $PLL_1$ receiving the samples $PCR_r$ and furthermore delivering local samples $PCR\_loc_1$ every period $T_{smp}$ and a reconstituted clock $CLK\_out_1$;

initializing, at all the zero-crossings of the counting ramp $CSR\_PCR_1$, an image counter CPT which is regulated by the reconstituted clock $CLK\_out_1$;

generating image pips every zero-crossing of the said image counter CPT; and reconstituting a synchronization signal on the basis of the said image pips;

characterized in that it comprises, furthermore, means for:

receiving packets containing a phase deviation value Δφ;

when the phase deviation value Δφ is received:

phase-shifting the samples received $PCR_r$ by the phase shift value Δφ, so as to generate phase-shifted samples $PCR_c$;

supplying the phase-locked loop PLL with the phase-shifted samples $PCR_c$.

Preferably, the synchronization signal is of Genlock type.

According to an embodiment, the counter $CPT_1$ is a PCR ("Program Clock Reference") counter. The counter CPT can be a 40-ms counter.

According to a particular mode of implementation, the time base synchronized on all the stations of the network is of IEC61588 type.

An advantage of the invention resides in the capacity that the sending device offers to ensure simultaneous phase control of synchronization signals intended to synchronize different items of equipment. Specifically, if several phase deviation values are transmitted simultaneously to the packets by the sending device, the phase shifts of the samples received are carried out by the reception devices. Thus, each reception device controls the phase of the samples that it receives with the phase deviation value intended for it, without modifying the phase of the samples arriving at the other reception devices.

BRIEF DESCRIPTION OF THE DRAWINGS

The invention will be better understood with the aid of the description, given hereinafter purely by way of explanation, of an embodiment of the invention, with reference to the appended figures.

DETAILED DESCRIPTION OF THE EMBODIMENTS OF THE INVENTION

Figure 1:
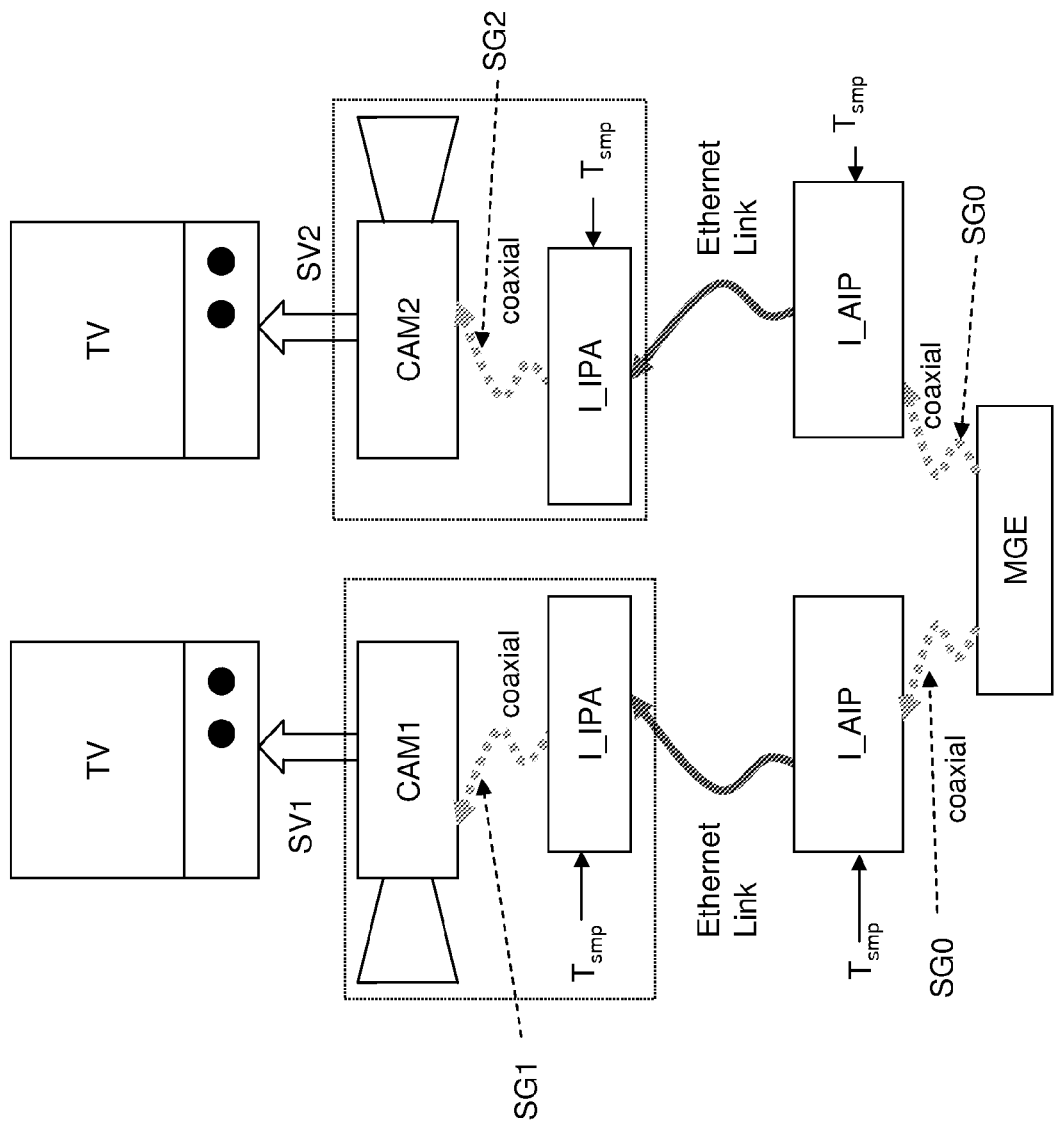
FIG. 1 illustrates the transmission of Genlock information between two cameras linked by an IP/Ethernet network.

The present analogue world is interfaced to the IP/Ethernet network send side, and the IP/Ethernet network is interfaced to the analogue world receive side, as is illustrated in FIG. 1.

In this same figure, the send side consists of a "Genlock Master" MGE which is connected to an Analogue/IP interface I_AIP. The Genlock Master MGE produces a Genlock signal SG0 destined for the interfaces I_AIP.

The receive side consists of two cameras (CAM1, CAM2) each connected to an IP/Analogue interface I_IPA. The interfaces I_IPA which will, eventually, be included in the cameras themselves have the task of reconstructing Genlock signals SG1, SG2 destined for the cameras CAM1, CAM2. The cameras CAM1, CAM2 each produce a video signal SV1, SV2 that one wishes to fully synchronize.

The send and receive sides are linked together by a packet switching network which gives rise to jitter appearing on the Genlock signal SG0.

A sampling pip, at the period $T_{smp}$, is generated on the basis of a first synchronization layer, for example IEEE1588, and is addressed to the send and receive sides. Specifically, the PTP protocol (the acronym standing for "Precision Time Protocol") based on IEEE1588 makes it possible to obtain synchronization between the items of equipment connected to an Ethernet network of the order of a microsecond. Stated otherwise, all the time bases of each item of equipment evolve at the same time to within a precision of the order of a microsecond. These time bases can be used in this case to each generate their own sampling pip at the period $T_{smp}$. The use of the IEEE1588 layer is not a compulsory route. Any system making it possible to provide sampling pips at the period $T_{smp}$ on the various items of equipment connected to a network could be suitable. It is possible for example to use a sampling pip of period 5 ms arising from a wireless transmission physical layer.

Figure 2:
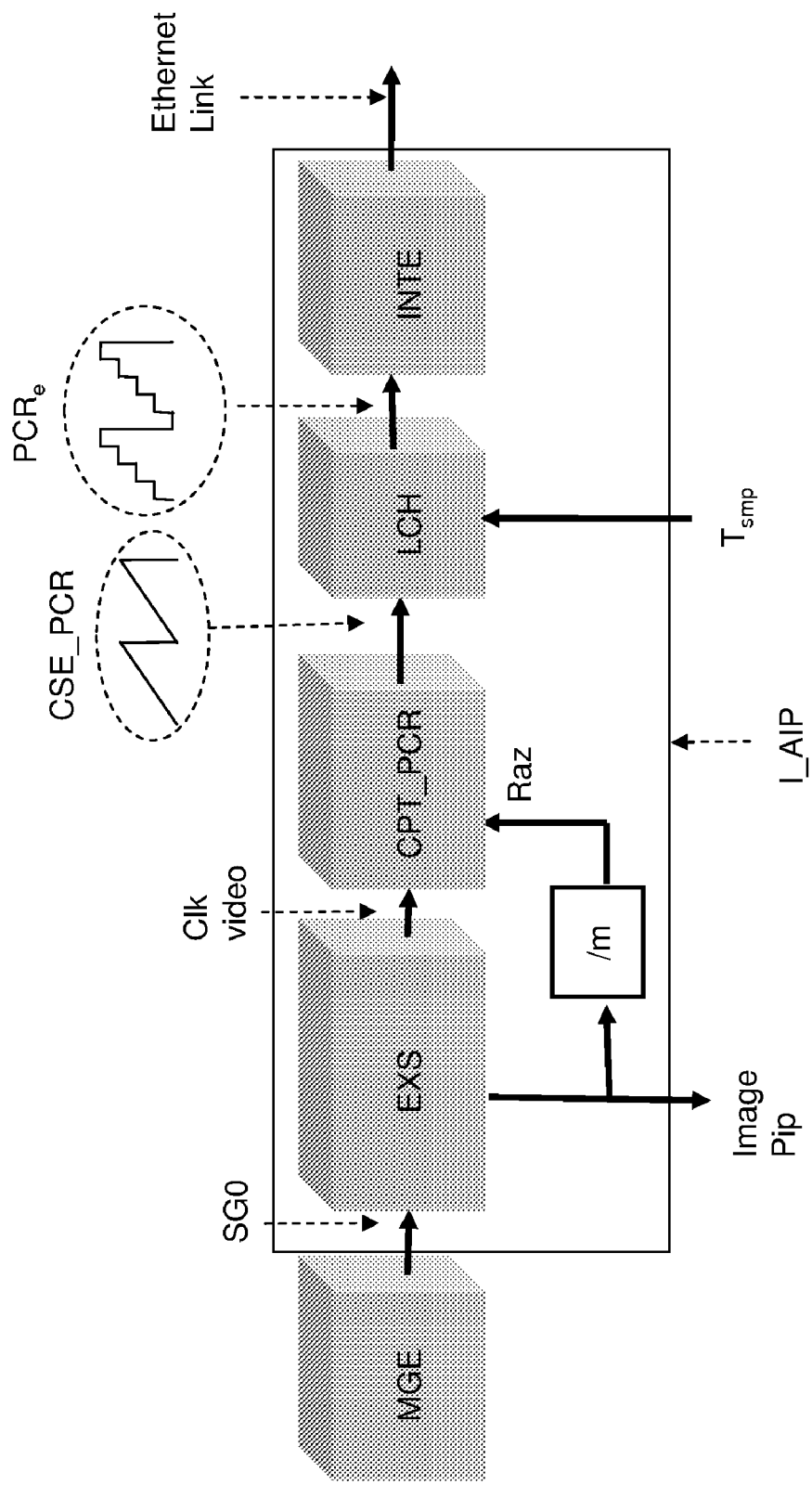
FIG. 2 illustrates the interfacing between an analogue domain and an IP/Ethernet network, according to the prior art.
Figure 3:
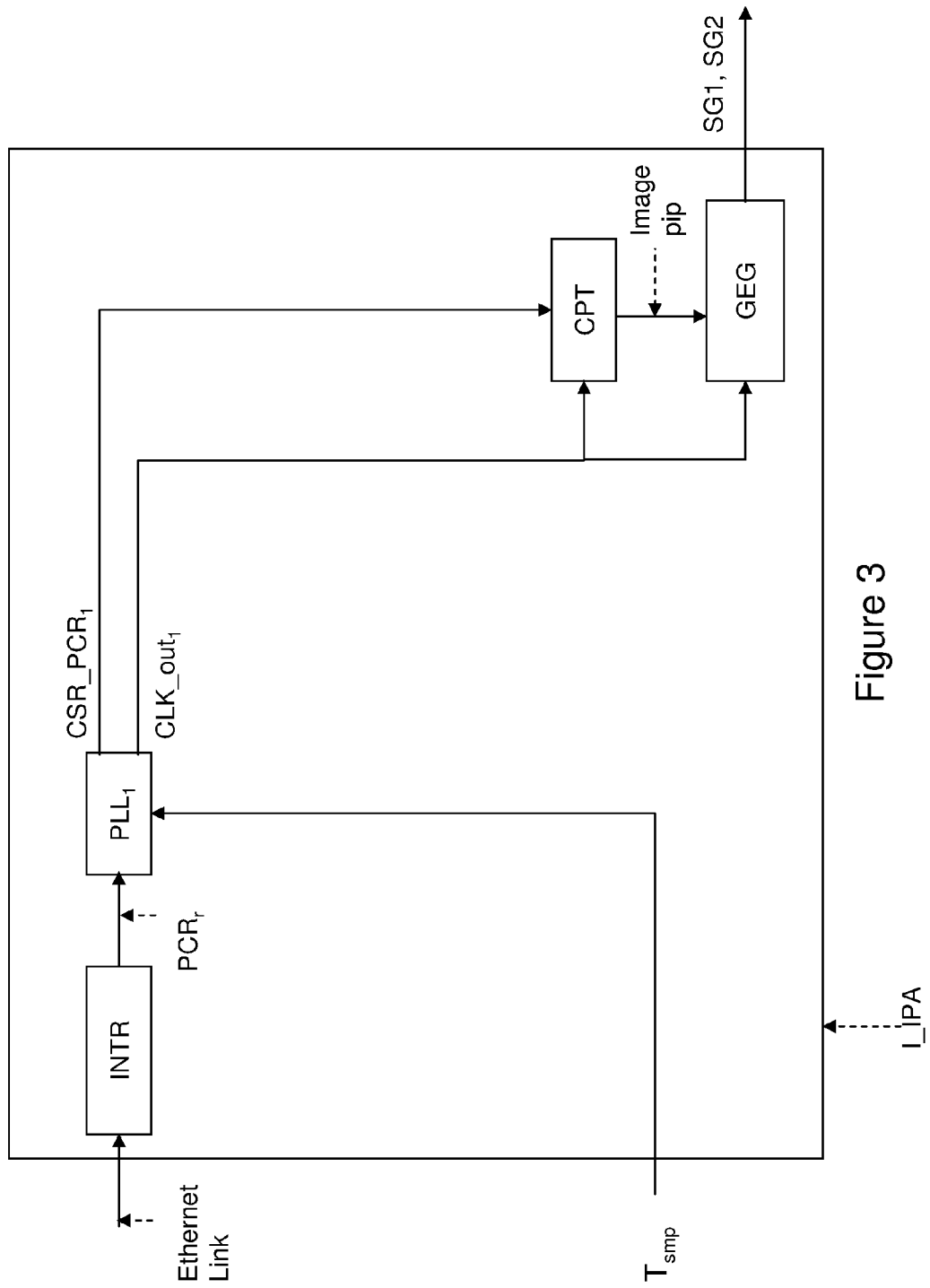
FIG. 3 illustrates the regeneration of the Genlock signal receive side according to the prior art.

Detailed in FIG. 2 are processings of the Genlock signal SG0 arising from MGE, within the interface I_AIP.

First of all, a module EXS extracts synchronization information for the signal SG0 so as to recover a video timing clock (denoted video Clk in FIG. 2). More precisely, the module EXS has the task of generating an image pip at each image start. Moreover, the module EXS comprises an image counter, for example a 40-ms counter, which is not represented in FIG. 2. The output of this image counter evolves according to a counting ramp passing through 0 at each image period, that is to say every 40 ms if the image counter cited as an example above is considered.

The video timing clock is employed to regulate a counter CPT_PCR. The output of the counter CPT_PCR is a counting ramp CSE_PCR, whose period equals m image periods.

Every "m" images, the counter CPT_PCR is reinitialized, that is to say the counting ramp CSE_PCR is reset to 0.

Subsequently, a module LCH samples the counting ramp CSE_PCR every period $T_{smp}$ to produce samples $PCR_e$. These samples $PCR_e$ are dispatched to the network and travel up to the receive side through an interface with network (block INTE).

Figure 4:
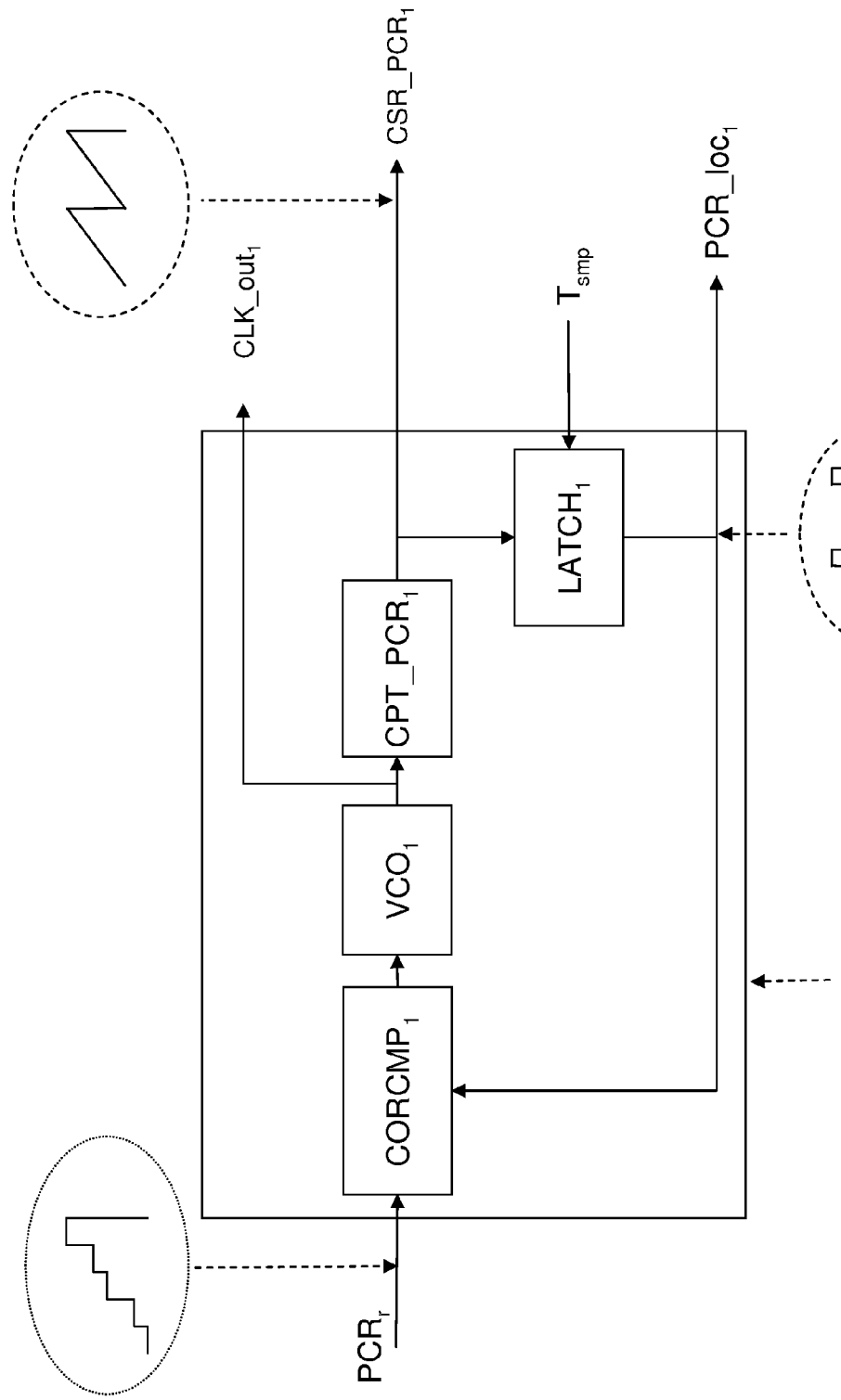
FIG. 4 illustrates the operation of a phase-locked loop employed on the receive side according to the prior art.

FIG. 4 represents the receive side according to the prior art. The interface I_IPA recovers the samples $PCR_e$ which have been dispatched to the network. These samples $PCR_e$ are received through a network interface (module INTR) with a delay related to the transport between the sending device and the reception device: the module INTR produces samples $PCR_r$. The samples $PCR_e$, which have been produced at regular intervals $T_{smp}$ send side, reach the receive side at irregular intervals: this is due predominantly to the jitter introduced during transport over the network. The samples $PCR_r$ are taken into account at regular intervals $T_{smp}$ and therefore the major part of the jitter introduced during packet transport is eliminated.

The lack of precision between the send and receive sampling instants is absorbed by a phase-locked loop $PLL_1$ whose bandwidth is appropriate. The characteristics of the loop $PLL_1$ guarantee a reconstituted clock $CLK\_out_1$ generation with a reduced jitter.

The phase-locked loop $PLL_1$ behaves as a system receiving samples $PCR_r$ and delivering:
a reconstituted clock $CLK\_out_1$,
a counting ramp $CSR\_PCR_1$ and,
local samples $PCR\_loc_1$.

When the loop $PLL_1$ operates in the steady state, the samples $PCR_r$ are substantially equal to the samples $PCR\_loc_1$.

The reconstituted clock $CLK\_out_1$ regulates an image counter CPT similar to the send side image counter, for example a 40-ms counter. The image counter CPT is reinitialized each time the counting ramp $CSR\_PCR_1$ crosses through 0. Between two successive initializations, the image counter CPT evolves freely and produces an image pip which supplies a local Genlock generator, GEG to produce a reconstructed Genlock signal SG1, SG2 intended to synchronize the cameras CAM1, CAM2.

The reconstructed Genlock signal SG1, SG2, which is generated on the basis of the counting ramp $CSR\_PCR_1$ and reconstituted clock $CLK_{13}\ out_1$, is in phase with the Genlock signal SG0 on the send side, to within a clock tick. The loop $PLL_1$ ensures a filtering which can be modelled as a low-pass filter of order 2.

FIG. 4 illustrates a mode of operation of a phase-locked loop $PLL_1$ employed in an interface I_IPA. As represented in FIG. 4, the phase-locked loop $PLL_1$ comprises:
a corrector/comparator $CORCMP_1$ which receives the samples $PCR_r$ as well as the local samples $PCR\_loc_1$. $CORCMP_1$ delivers a samples comparison result;
a digital oscillator $VCO_1$ which is controlled by a samples comparison result and which delivers a reconstituted clock $CLK\_out_1$;
a counter $CPT\_PCR_1$ producing a counting ramp $CSR\_PCR_1$ according to a timing regulated by the reconstituted clock $CLK\_out_1$,
a value holding system $LATCH_1$, which generates local samples $PCR\_loc_1$ on the basis of the values of the counting ramp $CSR\_PCR_1$ at the instants $T_{smp}$.

The problem area of compensating the duration of inter-station information transport is solved by measuring a duration of information transport for an outward-return trip between the send side and the receive side so as to determine and send a phase deviation value to be applied to the samples received on the receive side. The major constraint for this to be achievable is that the instants of sampling of the counter CPT_PCR (send side) and those regulating the sampling carried out within the phase-locked loop of the reception device are identical.

The technical problem posed to the person skilled in the art is that consisting in generating or transmitting an image pip through an IP/Ethernet network (introducing strong jitter) with a phase shift that is given with the send. It can be solved by simultaneously transmitting samples $PCR_e$ serving to reconstruct a local clock and a phase shift value to be assigned on receipt of the samples.

Figure 5:
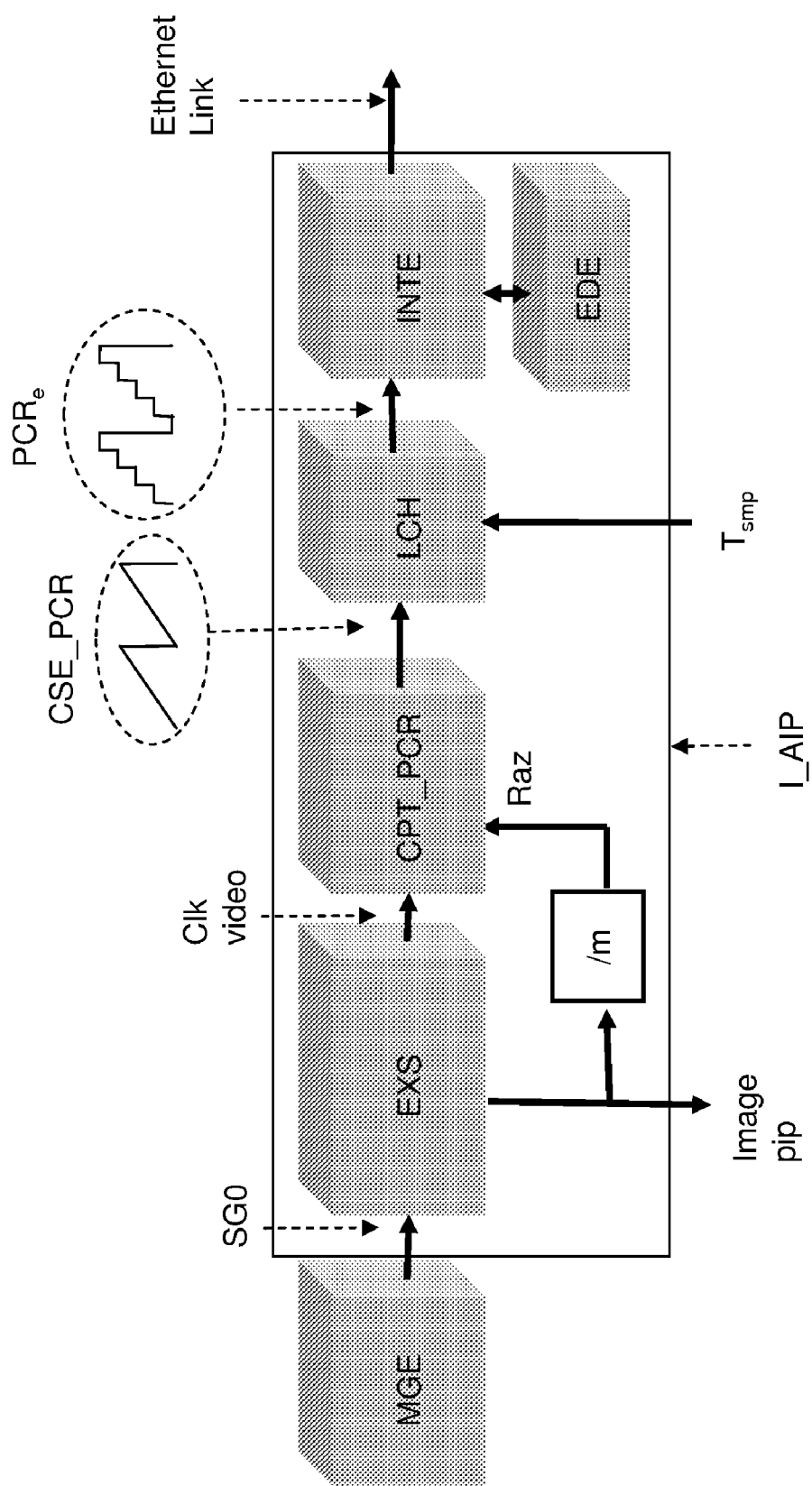
FIG. 5 illustrates the interfacing between an analogue domain and an IP/Ethernet network, according to the invention.

FIG. 5 illustrates the generation of samples $PCR_e$ send side, according to the invention. The analogue/IP interface I_AIP comprises, furthermore, a phase shift relay module EDE. The module EDE comprises means for:
receiving at least one phase deviation value $\Delta\phi$ to be applied;
when the phase deviation value $\Delta\phi$ is received, sending the phase deviation value $\Delta\phi$ in the network.

Advantageously, the phase deviation value $\Delta\phi$ is associated with a station linked to the network.

Advantageously, the phase deviation value $\Delta\phi$ is determined by a reception device of a station linked to the network.

Advantageously, the phase deviation value $\Delta\phi$ results from a calculation carried out by a calculation device linked to the network.

Advantageously, the phase deviation value $\Delta\phi$ results from a manual operation of an operator on a device linked to the network.

For example, the phase deviation value $\Delta\phi$ is a value linked to a number of manual presses of a press button of a station linked to the network.

The phase deviation value $\Delta\phi$ takes for example the form of a field whose length depends on the maximum number of periods of the reconstituted clock $CLK\_out_1$ that one may wish to compensate. Thus, for a field coded on 8 signed bits, it is possible to offset phase deviations corresponding to +128 periods of the reconstituted clock $CLK\_out_1$ or up to −127 clock periods $CLK\_out_1$ whereas the samples $PCR_e$ are coded on 32 bits or 64 bits for cameras operating under high-definition HD.

Figure 6:
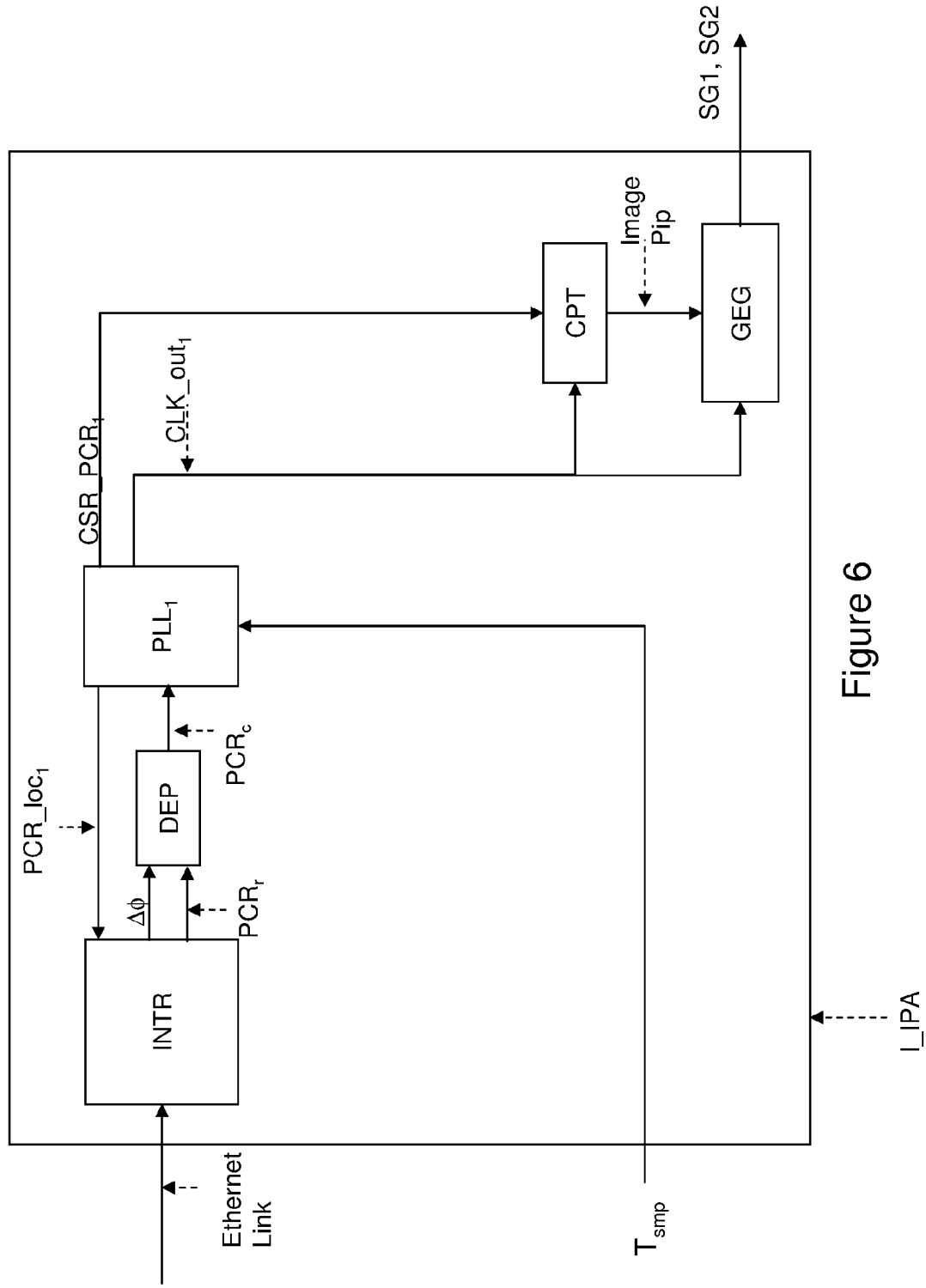
FIG. 6 illustrates the generation of the Genlock signal receive side, according to the invention.

FIG. 6 illustrates the reception of the Genlock signal according to the invention. The IP/analogue interface I_IPA furthermore comprises a phase shift module DEC. The module DEC comprises means for:
receiving packets containing a phase deviation value $\Delta\phi$;
when the phase deviation value $\Delta\phi$ is received:
phase-shifting the samples received $PCR_r$ by the phase shift value $\Delta\phi$, so as to generate phase-shifted samples $PCR_e$;
supplying the phase-locked loop $PLL_1$ with the phase-shifted samples $PCR_e$.

Figure 7:
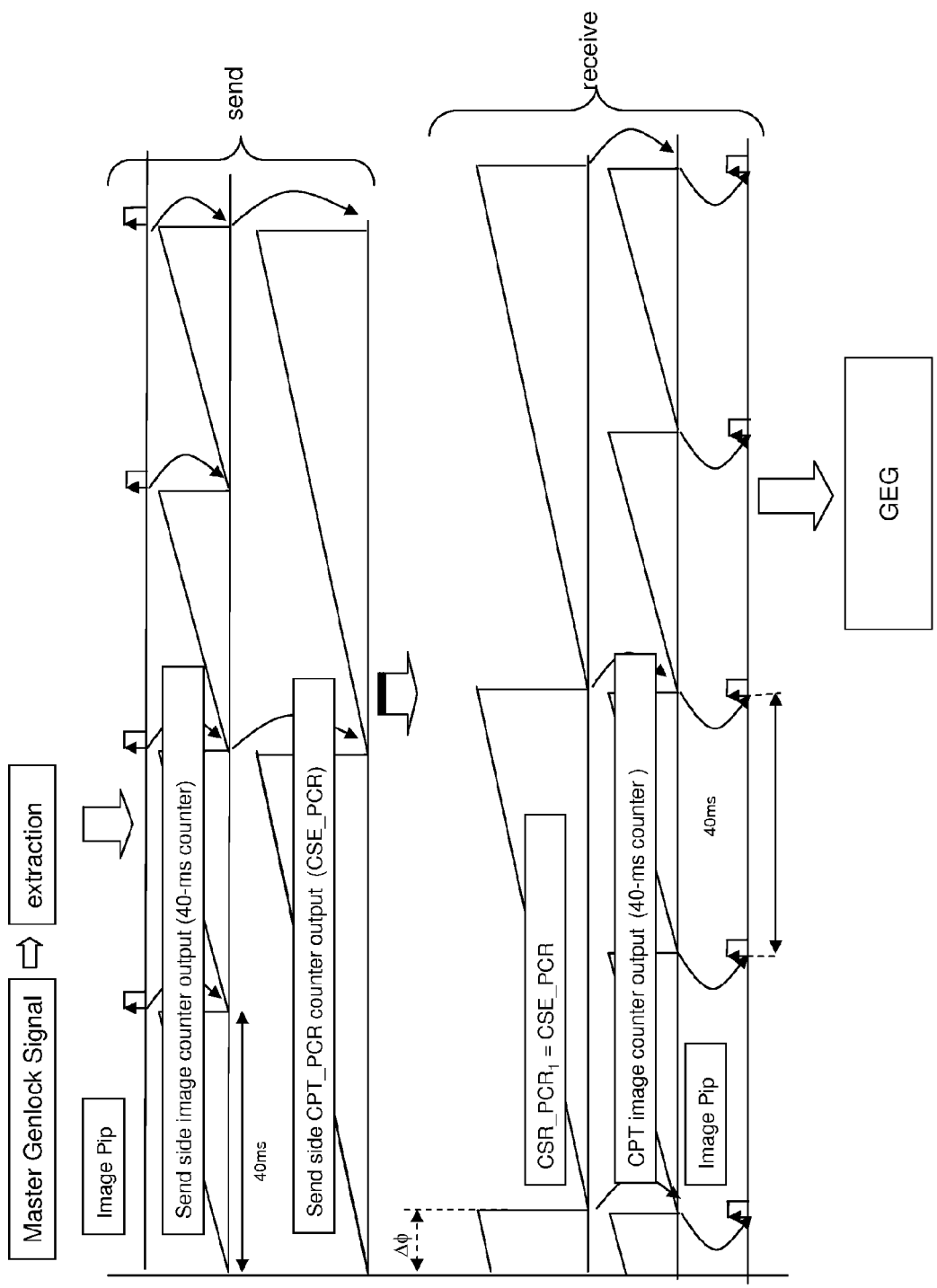
FIG. 7 represents counting ramps and image counter outputs on the send side and on the receive side with a non-zero phase deviation value Δφ.

FIG. 7 illustrates the transmission of potential image pip information.

Send side: on the basis of the Genlock signal SG0, image pips are extracted. On the basis of the image pips, for example of 40 ms recurrence, the sending image counter is initialized. Every "m" zero-crossings of the sending image counter, the counter CPT_PCR is initialized: that is to say the output ramp CSE_PCR produced by the counter CPT_PCR is set to zero periodically. A sampling of the output ramp CSE_PCR, at a timing rate $T_{smp}$ provided by the network, produces samples $PCR_e$ which are dispatched in packets to the network.

In parallel with the sending of the samples $PCR_e$, a phase deviation value $\Delta\phi$ is received by the network: this value $\Delta\phi$ is inserted into the packets sent by the sending device according to the invention.

Receive side: the reception device jointly receives samples $PCR_r$ and a phase shift value $\Delta\phi$ originating from the sending device. The value $\Delta\phi$ has been received by the sending device and is relayed up to the reception device.

The samples received $PCR_r$ are phase-shifted by the value $\Delta\phi$ to give phase-shifted samples $PCR_c$. The phase-locked loop PLL, which receives the phase-shifted samples $PCR_c$ generates a counting ramp $CSR\_PCR_1$, which exhibits a phase deviation $\Delta\phi$ with the counting ramp CSE_PCR.

When the ramp $CSR\_PCR_1$ crosses through zero, the reception image counter CPT is initialized and thereafter evolves freely. The latter will remain necessarily synchronous with the counter $CPT\_PCR_1$ since they both use the same reconstituted clock $CLK\_out_1$. The crossing through zero of the output of the reception image counter CPT makes it possible to generate the reception image pip. On the basis of this reception image pip, it is possible to reconstruct with the Genlock signal SG1, SG2 receive side.

As the PCR CSE_PCR and $CSR\_PCR_1$ counting ramps are phase-shifted by a value $\Delta\phi$, the image counters (40-ms counter) send and receive side are also phase-shifted by a value $\Delta\phi$, and therefore the send and receive image pips are necessarily shifted temporally by a value corresponding to the phase deviation $\Delta\phi$. Moreover, the receive side image pip has no jitter with respect to the receive side video clock.

Figure 8:
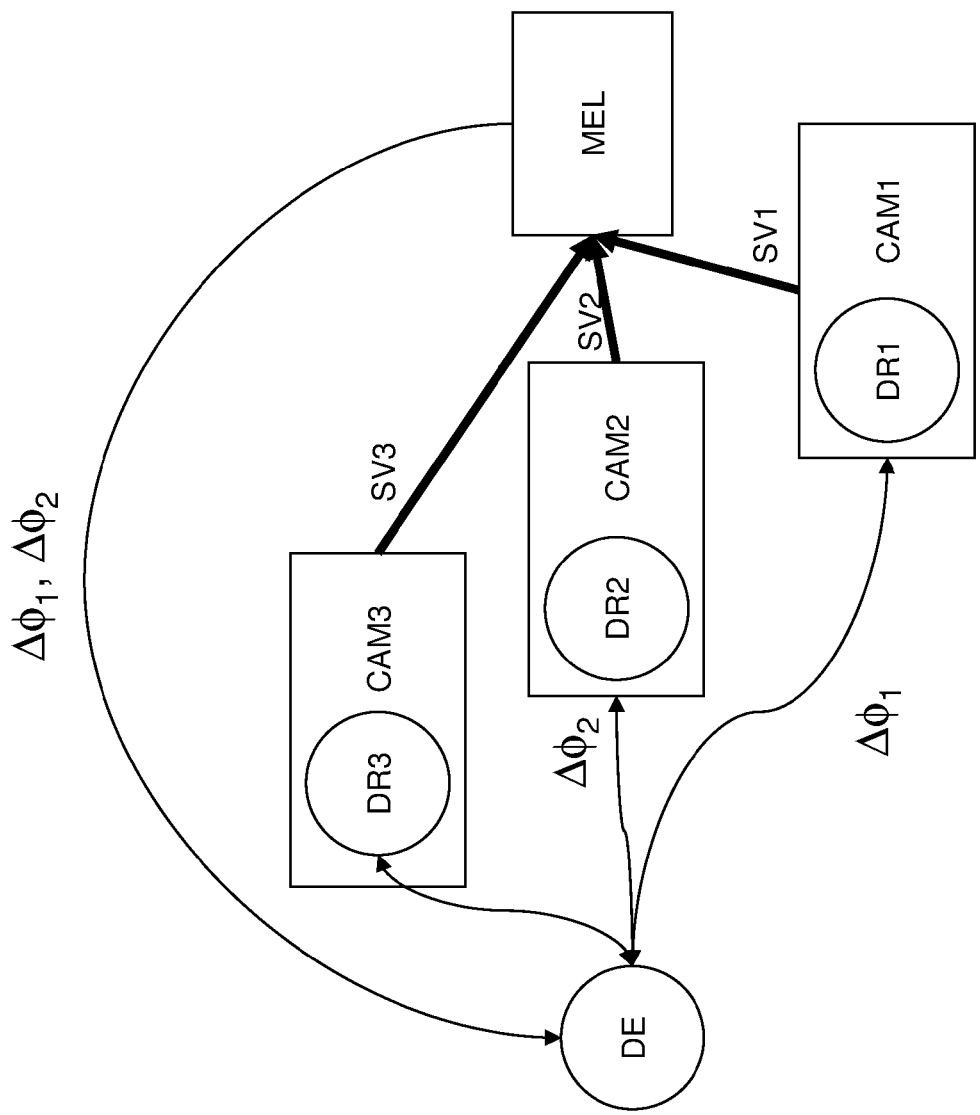
FIG. 8 represents an exemplary use of the invention.

FIG. 8 represents an application of the invention. A sending device according to the invention DRE is linked by a packet switching network to three reception devices according to the invention DR1, DR2, DR3 which are each integrated into a camera CAM1, CAM2, CAM3. Each camera produces a video signal SV1, SV2, SV3 which is dispatched to one and the same mixer MEL by means of a coaxial cable. The cables all have a different length. This difference in cable length causes the difference in duration of transport of the video signals. Thus, when the cameras CAM1, CAM2, CAM3 are fully inter-synchronized, the video signals SV1, SV2, SV3 do not arrive simultaneously at the mixer MEL. Phase shift values $\Delta\phi 1$, $\Delta\phi 2$ are then communicated to the sender device DE so that they are relayed up to the reception devices. The phase shift values $\Delta\phi 1$, $\Delta\phi 2$ are, for example, determined at the level of the mixer MEL so that the video signals arrive simultaneously at the level of the mixer MEL. A single sending device makes it possible to address a different phase shift value to each reception device DR1, DR2, DR3.

The invention is described in the foregoing by way of example. It is understood that the person skilled in the art is in a position to implement various alternatives of the invention without however departing from the scope of the patent.

The invention claimed is:

1. A device operative to send packets in a packet communication network comprising at least two stations, said device comprising:
    means for extracting image pips on the basis of a synchronization signal;
    means for initializing a first counter on the basis of the said image pips;
    means for initializing a second counter on the basis of the first counter, the second counter being regulated by a clock produced by the first counter;
    means for sampling the second counter every period $T_{smp}$, where $T_{smp}$ emanates from a time base synchronized on all the stations connected over said network;
    means for sending packets containing the samples of the second counter in the network;
    means for receiving a local sample value from one of the stations in the network in response to at least one of the samples of the second counter sent in the network;
    means for determining a phase deviation value $\Delta\phi$ in response to the received local sample value; and
    means for inserting the determined phase deviation value $\Delta\phi$ into one or more packets and sending said one or more packets in the network.

2. The device according to claim 1, wherein the one or more packets containing the determined phase deviation value $\Delta\phi$ are addressed to the station that sent the local sample value.

3. The device according to claim 1, wherein the phase deviation value $\Delta\phi$ is determined by a reception device connected over the network.

4. The device according to claim 1, wherein the phase deviation value $\Delta\phi$ results from a manual operation of an operator on another device linked to the network.

5. The device according to claim 1, wherein the synchronization signal is of Genlock type.

6. The device according to claim 1, wherein the second counter is a program clock reference (PCR) counter.

7. The device according to claim 1, wherein the time base synchronized on all the stations of the network is of IEC61588 type.

8. A device operative to receive packets in a packet communication network comprising at least two stations, said device comprising:
    means for receiving packets containing samples of the network, the samples originating from data sampled every period $T_{smp}$, where $T_{smp}$ emanates from a time base synchronized on all the stations of the network;
    means for generating a counting ramp via a phase-locked loop receiving the samples and furthermore delivering local samples every period $T_{smp}$ and a reconstituted clock;
    means for initializing, in response to the counting ramp, an image counter which is regulated by the reconstituted clock;
    means for generating image pips in response to said image counter;
    means for reconstituting a synchronization signal on the basis of said image pips;
    means for receiving packets containing a phase deviation value $\Delta\phi$;
    means for phase-shifting the samples received by the phase deviation value $\Delta\phi$; and
    means for supplying the phase-locked loop with the phase-shifted samples.

9. The device according to claim 8, wherein the synchronization signal is of Genlock type.

10. The device according to claim 8, wherein the image counter is a program clock reference (PCR) counter.

11. The device according to claim 8, wherein the time base synchronized on all the stations of the network is of IEC61588 type.

* * * * *